United States Patent [19]

Segawa et al.

[11] Patent Number: 4,554,469
[45] Date of Patent: Nov. 19, 1985

[54] STATIC BOOTSTRAP SEMICONDUCTOR DRIVE CIRCUIT

[75] Inventors: Makoto Segawa; Shoji Ariizumi, both of Tokyo, Japan

[73] Assignee: Tokyo Shibaura Denki Kabushiki Kaisha, Japan

[21] Appl. No.: 469,631

[22] Filed: Feb. 25, 1983

[30] Foreign Application Priority Data

Feb. 26, 1982 [JP] Japan .................................. 57-29905

[51] Int. Cl.<sup>4</sup> ..................... H03K 17/06; H03K 19/094
[52] U.S. Cl. .................................. 307/482; 307/443; 307/449; 307/578; 307/601
[58] Field of Search ............... 307/270, 449, 450, 463, 307/482, 578, 443, 594, 601

[56] References Cited

U.S. PATENT DOCUMENTS 4,122,361 10/1978 Clemen et al. ....................... 307/208
4,165,541 8/1979 Varshney et al. .................... 365/219
4,500,799 2/1985 Sud et al. ......................... 307/450 X

OTHER PUBLICATIONS

*IBM Technical Disclosure Bulletin*, vol. 19, No. 1, Jun. 1976, pp. 28–29, Huffman, D. R.; Rossi, F. R.; Shea, D. J. "Memory Address Decode Circuit".
Joynson et al., "Eliminating Threshold Losses in MOS Circuits by Bootstrapping Using Varactor Coupling" IEEE Journal of Solid-State Circuits, vol. SC-7, No. 3, Jun. 1972.

*Primary Examiner*—Stanley D. Miller
*Assistant Examiner*—D. R. Hudspeth
*Attorney, Agent, or Firm*—Finnegan, Henderson Farabow, Garrett & Dunner

[57] ABSTRACT

A semiconductor circuit has a static bootstrap circuit, which includes a first MOS transistor with an input signal supplied to the gate and having the current path connected between a voltage source terminal and a node, a second MOS transistor having the gate connected to receive an inverted form of the input signal after a delay time and having the current path connected between the node and a reference potential terminal and a capacitor connected between the gate of the first MOS transistor and the node. The semiconductor circuit also has a short pulse generator. The bootstrap circuit further includes a third MOS transistor having the current path connected between the output terminal of the short pulse generator and the node and with the input signal supplied to the gate and fourth and fifth MOS transistors having the respective gates connected to the gates of the first and second MOS transistors and the respective current paths connected in series between the voltage source terminal and reference potential terminal.

15 Claims, 6 Drawing Figures

F I G. 6
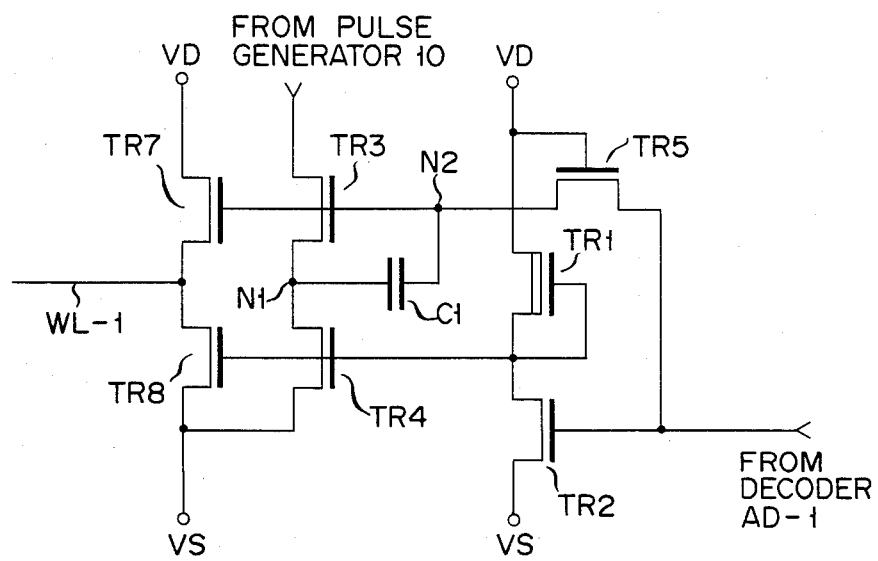

STATIC BOOTSTRAP SEMICONDUCTOR DRIVE CIRCUIT

BACKGROUND OF THE INVENTION

This invention relates to a semiconductor circuit with a static bootstrap circuit.

Recently, the integration density and operation speed of semiconductor integrated circuits are increasing very much. Particularly, the operation speed on n-channel MOS static random access memories (RAM) has risen as high as that of bipolar RAMs. The increase in the operation speed of this type of RAM, however, increases the power consumption. A static bootstrap circuit has been used to realize a RAM which can operate at a high speed with low power consumption. The power consumption of the bootstrap circuit is low because no steady-state current flows therein. The bootstrap circuit thus can be designed to provide a driving capacity corresponding to the desired driving speed.

The static bootstrap circuit of this type, however, presents problems when it is used under non-synchronous operating conditions. It requires a certain precharge set-up time for its normal bootstrap action. Sometimes a sufficiently long precharge set-up time cannot be provided under non-synchronous operating conditions. In such a case, a sufficiently effective bootstrap action cannot be obtained, leading to reduced operating speed or erroneous operation.

FIG. 1 shows a prior art static bootstrap circuit. This bootstrap circuit includes a depletion type (D-type) MOS transistor TR1 and an enchancement type (E-types) MOS transistor TR2 which have their current paths connected in series between voltage source terminals VD and VS to which a power source voltage VDD and a reference voltage VSS are respectively applied and constitute a delaying inverter DI, and E-type MOS transistors TR3 and TR4 having their current paths connected in series between the voltage source terminals VD and VS. The gate of the MOS transistor TR4 is connected to the output terminal of the inverter DI. A node N1 between the MOS transistors TR3 and TR4 is connected to an output terminal VO. The bootstrap circuit further includes an E-type MOS transistor TR5 connected between the input terminal VI and the gate of the MOS transistor TR3, and a coupling capacitor C1, connected between the node N1 and the gate of the MOS transistor TR3. The voltage source terminal VS may be grounded.

Assume now that an input signal supplied to the input terminal VI begins to rise to a high level or VDD level. In this case, the output signal of the delaying inverter DI goes to a low level or VSS level. The capacitor C1 is thus charged according to the input signal until the MOS transistor TR4 is rendered nonconductive. When the VSS level is reached by the output signal of the delaying inverter DI, the MOS transistor TR4 is rendered nonconductive. As a result, the drain potential on the MOS transistor TR4, i.e., the potential on the node N1, begins to rise sharply toward the VDD level.

The gate potential on the MOS transistor TR3 is thus raised to be equal to or above the sum of the threshold voltage level VTH of the MOS transistor TR3 and VDD level by the bootstrap action of the capacitor C1. The potential on the node N1 thus ultimately reaches the VDD level.

The extent of charging of the coupling capacitor C1 that is necessary for the bootstrap action, depends on the potential difference across the capacitor C1 according to the delay time provided by the delaying inverter DI. This wll now be discussed in detail. To obtain an effective bootstrap action, the capacitor C1 must be sufficiently charged before the MOS transistor TR4 is rendered nonconductive. However, this is liable to fail when the spike noise, or glitch, is introduced into the input signal. Now, it is assumed that the potential on the node N1, i.e., the output signal, is raised to the VDD level as a result of the normal bootstrap action brought about with the rise of the input signal from the VSS level to the VDD level. If the input signal subsequently falls to an intermediate level and then returns to the VDD level in a short period of time, the coupling capacitor C1 is discharged through the MOS transistor TR5. In this case, the output signal falls to the intermediate level later than the fall of the input signal. Therefore, with the rising of the input signal again to the VDD level, a sufficient potential difference for the next bootstrap action is not built up across the capacitor C1. The next bootstrap action is thus insufficient, and the output signal no longer rises to the VDD level, thus causing an erroneous operation of the circuit that is connected to the output terminal VO.

SUMMARY OF THE INVENTION

An object of the invention is to provide a semiconductor circuit which includes a static bootstrap circuit capable of providing stable and high-speed bootstrap action.

In one form of the invention, there is provided a semiconductor circuit including a static bootstrap circuit, which comprises a first MOS transistor having the gate connected to receive an input signal through resistive means and having the current path connected at one terminal thereof to a node, a second MOS transistor supplied at the gate with an inverted delay input signal and having the current path connected between the node and a reference potential terminal, and capacitive means connected between the gate of the first MOS transistor and the node. The semiconductor circuit further comprises a short pulse generation circuit. The bootstrap circuit includes potential setting means connected to the short pulse generation circuit and to the node to set the potential on the node to a predetermined potential level in response to a short pulse from the short pulse generation circuit. The bootstrap circuit further includes third and fourth MOS transistors having the gates connected to the gates of the respective first and second MOS transistors and the current paths connected in series between a voltage source terminal and the reference potential terminal.

According to the invention, to provide a bootstrap action, the potential on the node is brought to a low level in response to a short pulse produced from the short pulse generation circuit. When the period of the short pulse has elapsed, the potential on the node is quickly raised to a high level through the first MOS transistor, so that sufficient bootstrap action can be obtained.

BRIEF DESCRIPTION OF THE DRAWINGS

FIG. 6 is a circuit diagram showing a modification of the buffer decoder shown in FIG. 3.

DETAILED DESCRIPTION OF THE PREFERRED EMBODIMENTS

Figure 2:
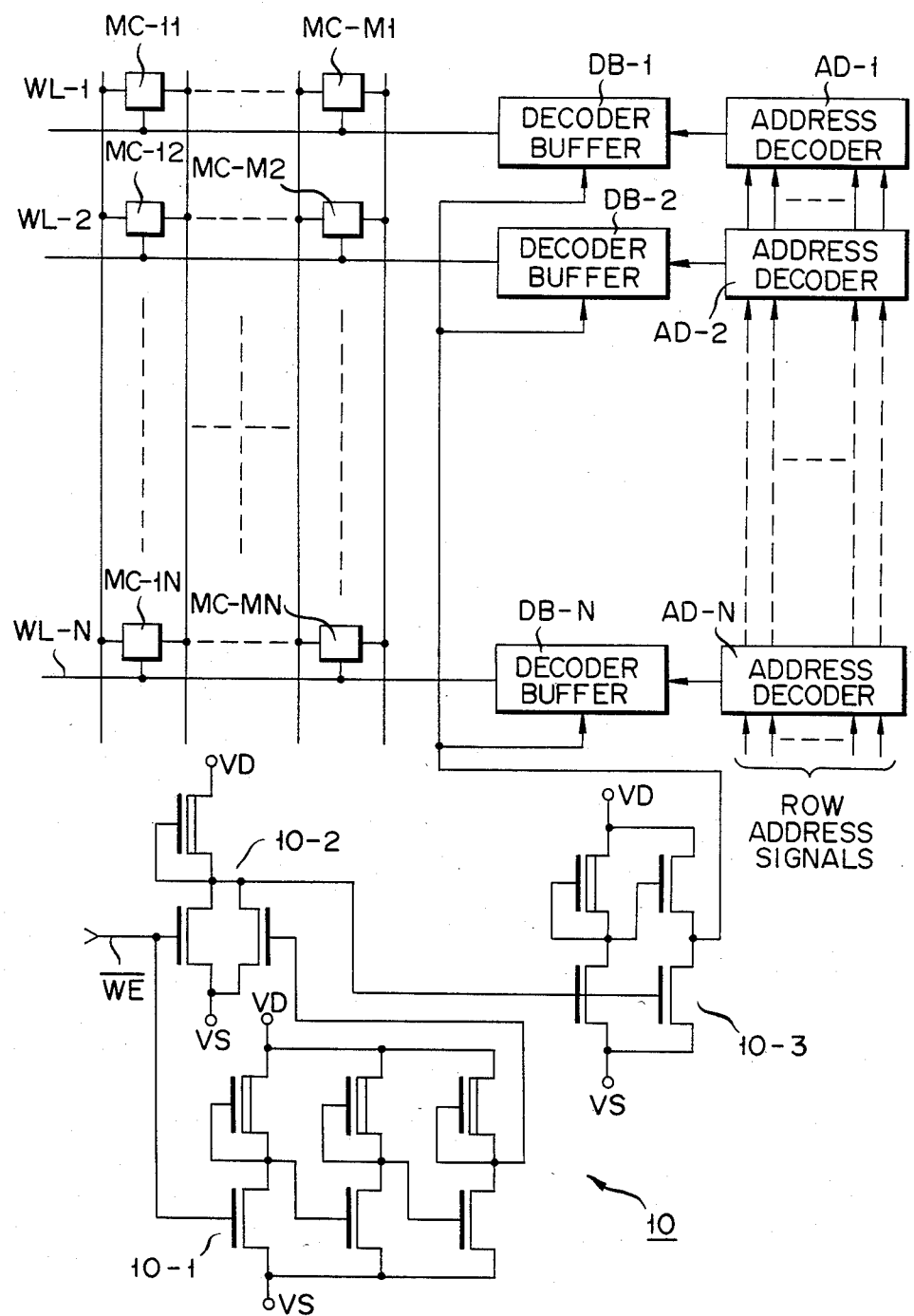
FIG. 2 is a view showing a RAM using a semiconductor circuit having a static bootstrap circuit embodying the invention.

FIG. 2 shows a static RAM including decoder buffers DB-1 to DB-N each constituted by a static bootstrap circuit embodying the invention. The RAM further includes M×N memory cells MC-11 to MC-MN arranged in a matrix array and address decoders AD-1 to AD-N which commonly receive address signals from an address designating circuit (not shown). The output terminals of the address decoders AD-1 to AD-N are connected to the respective buffer decoders DB-1 to DB-N. The output terminals of the decoder buffers DB-1 to DB-n are connected to respective word lines WL-1 to WL-N. M memory cells in each row are commonly connected to the corresponding word line. The RAM further includes a short pulse generator 10, which supplies a short pulse to the decoder buffers DB-1 to DB-N in response to a write enable signal $\overline{WE}$. The short pulse generator 10 includes a delaying inverter 10-1, which inverts the write enable signal $\overline{WE}$ with a predetermined delay time; a NOR circuit 10-2 which receives the output signal of the delaying inverter 10-1 and the write enable signal $\overline{WE}$; and a buffer circuit 10-3 which supplies an output signal corresponding to the output signal of the NOR circuit 10-2 to the decoder buffers DB-1 to DB-N. The delaying inverter 10-1 has three inverter stages, each of which is formed of a D-type MOS transistor having the drain connected to a voltage source terminal VD and an E-type MOS transistor having the drain connected to the gate and source of the D-type MOS transistor, and the source connected to a voltage source terminal VS. The NOR circuit 10-2 has a D-type MOS transistor having the drain connected to the voltage source terminal VD and the gate and source connected to each other, and two MOS transistors connected in parallel between the D-type MOS transistor and the voltage source terminal VS. The write enable signal $\overline{WE}$ and the output signal of the delaying inverter 10-1 are supplied respectively to the gates of the E-type MOS transistors. The buffer circuit 10-3 has a D-type MOS transistor having the drain connected to the voltage source terminal VD and the gate and source connected to each other, a first E-type MOS transistor connected between the voltage source terminal VS and first E-type MOS transistor, a second E-type transistor having the drain connected to the voltage source terminal VD and a third E-type MOS transistor connected between the source of the second E-type MOS transistor and voltage source terminal VS. The source of the D-type MOS transistor is connected to the gate of the second E-type MOS transistor. The output terminal of the NOR circuit 10-2 is connected to the gates of the first and third MOS transistors. The connection point between the second and third E-type MOS transistors of the buffer circuit 10-3 is connected as the output terminal of the short pulse generator 10 to the decoder buffers DB-1 to DB-N.

Figure 1:
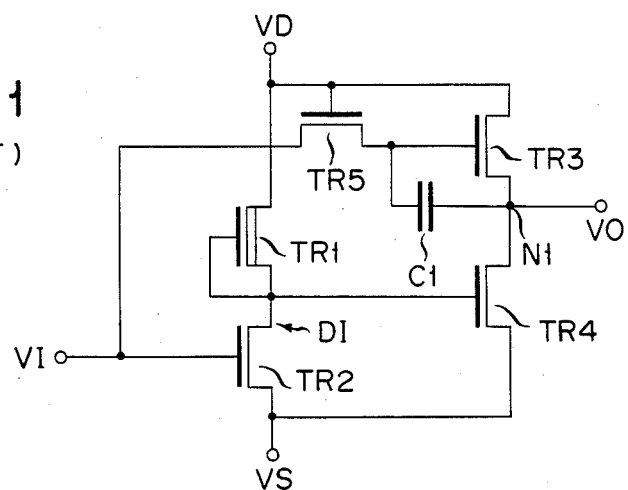
FIG. 1 is a circuit diagram showing a prior art bootstrap circuit.
Figure 3:
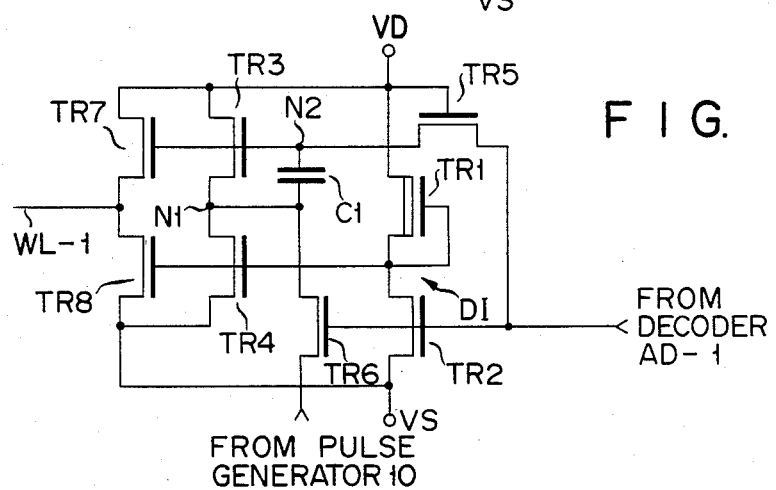
FIG. 3 is a circuit diagram showing one of buffer decoders used in the RAM shown in FIG. 2.

FIG. 3 shows the decoder buffer DB-1 in detail. The decoder buffers DB-2 to DB-N have the same construction as the decoder buffer DB-1. The decoder buffer DB-1 has the same construction as the bootstrap circuit shown in FIG. 1 except that it further includes an E-type MOS transistor TR6 which is connected between the node N1 and the output terminal of the short pulse. generator, and E-type MOS transistors TR7 and TR8 which are connected in series between the voltage source terminals VD and VS. The MOS transistor TR6, like the MOS transistor TR2, has the gate connected to the output terminal of the address decoder AD-1. The gates of the MOS transistors TR7 and TR8 are respectively connected to the gates of the MOS transistors TR3 and TR4. The connection point between the MOS transistors TR7 and TR8 is connected as the output terminal of the decoder buffer DB-1 to the word line WL-1.

Figure 4:
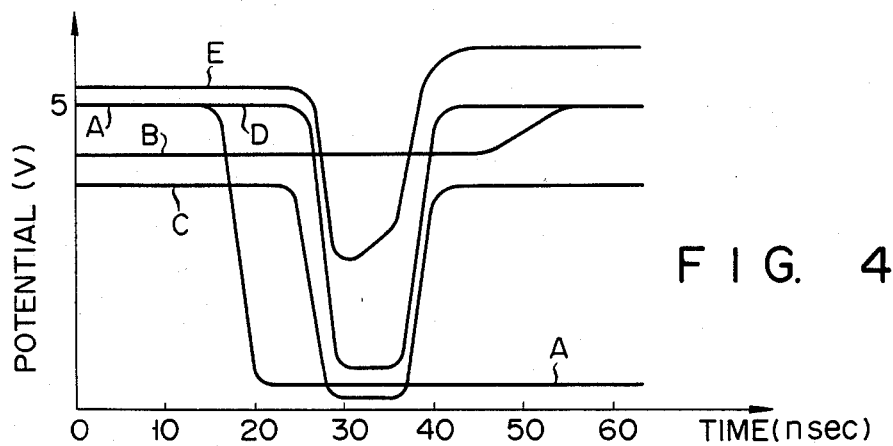
FIG. 4 is a waveform chart for explaining the operation of the short pulse generator and buffer decoder shown in FIG. 2.

The operation of the RAM shown in FIGS. 2 and 3 will now be described with reference to the signal waveform diagram shown in FIG. 4. Suppose now that the write enable signal $\overline{WE}$ is at high level as shown by curve A in FIG. 4, and the RAM is in a read mode. Also suppose that the address decoder AD-1 is providing a high level output signal in response to the row address signals. Further, assume that the output signal of the address decoder AD-1 has been momentarily brought to an intermediate level due to superimposition of a glitch on the row address signals so that the output signal of the decoder buffer DB-1 has been brought to and is held at a level slightly lower than the VDD level, here 5 V, as shown by a curve B. In this state of the RAM, it is necessary to raise the output signal of the decoder buffer DB-1 up to the VDD level in order to effect the normal write operation.

When the write enable signal $\overline{WE}$ is at the high level, the NOR circuit 10-2 produces a low level signal, and the buffer circuit 10-3 generates a high level signal as shown by a curve C. When the write enable signal $\overline{WE}$ is brought to a low level for the write operation, the output signal of the NOR circuit 10-2 begins to rise. When the output signal of the NOR circuit 10-2 is raised to a predetermined level, the output signal of the buffer circuit 10-3 begins to fall to be brought to a low level as shown by a curve C.

When a predetermined period has been elapsed after the reaching of the low level by the write enable signal $\overline{WE}$, the delaying inverter 10-1 produces a high level signal, and the NOR circuit 10-2 generates a low level signal in response to the high level signal from the delaying inverter 10-1. As a result, the output signal of the buffer circuit 10-3 is brought to the high level again.

Since the address decoder AD-1 has been generating the high level output signal, the potential on the node N1 falls with the fall of the output signal of the buffer circuit 10-3 as shown by a curve D. The potential on the node N2, i.e., the potential of the gates of the MOS transistors TR3 and TR7, falls substantially to an intermediate level according to the fall of the potential on the node N1 as shown by a curve E. Since the capacitor C1 has been charged by the high level output signal of the address decoder AD-1, the potential on the node N2 does not fall so much, and it rises again toward the (VDD-VTH) level after the potential on the node N1 has settled to the low level. When the output signal of the short pulse generator 10 rises to the high level in this state, as shown by a curve C, the MOS transistor TR6 is rendered non-conductive, so that the potential on the node N1 rises quickly to the VDD level as shown by a curve D. Thus, a satisfactory bootstrap action is obtained to raise the potential on the node N2 to a level sufficiently higher than the VDD level. The MOS transistor TR7 is thus rendered completely conductive to cause the decoder buffer DB-1 to provide an output signal at the VDD level, whereby the potential on the word line WL-1 is brought to the VDD level as shown by the curve B. Now, normal write operation can be executed in the RAM.

Figure 5:
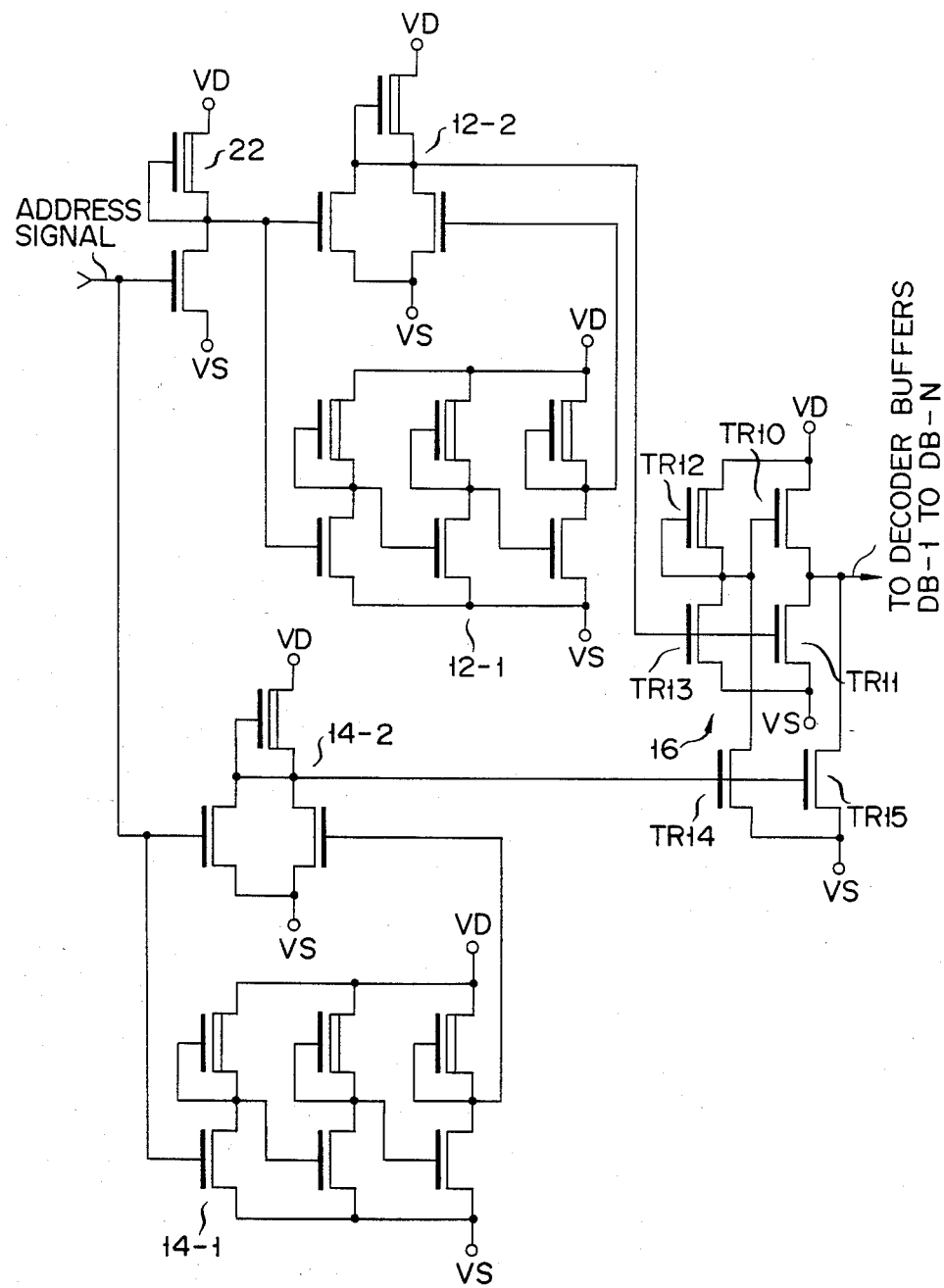
FIG. 5 is a circuit diagram showing a modification of the short pulse generator shown in FIG. 2.

FIG. 5 shows an example of the short pulse generator which generates a short pulse in response to the address signals. The short pulse generator includes delaying inverters 12-1 and 14-1, which have the same construction as the delaying inverter 10-1, and NOR circuits 12-2 and 14-2, which have the same construction as the NOR circuit 10-2 and are connected to the respective NOR circuits 12-1 and 14-1. The address signals are supplied to the delaying inverter 12-1 and NOR circuit 12-2 through an inverter 22, while they are supplied directly to the delaying inverter 14-1 and NOR circuit 14-2. The output signals of the NOR circuits 12-2 and 14-2 are fed to a buffer circuit 16. The buffer circuit 16 includes a series transistor circuit formed of E-type MOS transistors TR10 and TR11 and another series transistor circuit formed of D-type MOS transistors TR12 and TR13. These series transistor circuits are each connected between the voltage source terminals VD and VS. The buffer circuit 16 further includes an E-type MOS transistor TR14 connected between each of the gates of the MOS transistors TR10 and TR12 and the voltage source terminal VS and an E-type MOS transistor TR15 connected between a junction of the transistors TR10 and TR11 and the voltage source terminal VS. The buffer circuit 16 produces a low level signal when at least one of the output signals of the NOR circuits 12-2 and 14-2 is at the high level.

When the address input signal changes from the high level to the low level, the NOR circuit 14-2 provides a pulse signal, which is at the high level for a period corresponding to the delay time of the delaying inverter 14-1, in the manner as described before. The buffer circuit 16 thus produces a short pulse, which is at the low level for a period corresponding to the delay time of the delaying inverter 14-1. When the address input signal changes from the low level to the high level, the output signal of the inverter 22 changes from the high level to the low level. In this case, the NOR circuit 12-2 provides a pulse signal, which is at the high level for a period corresponding to the delay time of the delaying inverter 12-1. The buffer circuit 16 thus produces a short pulse which is at the low level for a short period of time. In this way, a short pulse which is at the low level for a short period of time is produced every time the address input signal level is changed. This short pulse is supplied to the decoder buffers DB-1 to DB-N to cause a satisfactory bootstrap action of a selected one of the decoder buffers DB-1 to DB-N. The selected decoder buffer thus produces an output signal of the VDD level.

FIG. 6 shows a modification of the decoder buffer shown in FIG. 3. This decoder buffer has the same construction as the decoder buffer shown in FIG. 3 except that this decoder is free from the MOS transistor TR6 and that the drain of the MOS transistor TR3 is connected not to the voltage source terminal VD but to the output terminal of the short pulse generator 10 shown in FIG. 2.

Assuming that a high level signal is being supplied from the address decoder AD-1 to the decoder buffer shown in FIG. 6, with appearance of a low level voltage at the drain of the MOS transistor TR3 this transistor is rendered conductive, bringing the potential on the node N1 to a low level. When the drain potential on the MOS transistor is subsequently raised to the high level again, the potential on the node N1 is quickly raised, causing quick rise of the potential on the node N2 or the gate potential on the MOS transistors TR3 and TR7 up to a sufficiently high level by the bootstrap action. Thus, the potential on the word line WL-1 is brought to the VDD level.

For obtaining satisfactory operation of the decoder buffer shown in FIG. 6, it is required to set the high level voltage that is applied to the drain of the MOS transistor TR3 to as close to the VDD level as possible. To meet this requirement, a D-type MOS transistor may be substituted for the E-type MOS transistor connected between the voltage source terminal and output terminal of the buffer circuit 10-3 in the short pulse generator shown in FIG. 2. Alternatively, a D-type MOS transistor may be substituted for the E-type MOS transistor connected between the voltage source terminal VD and the output terminal of the buffer circuit 16 in the short pulse generator shown in FIG. 5.

While some preferred embodiments have been described, it is to be understood that these embodiments are by no means limitative. For example, while in the above embodiments the write enable signal $\overline{WE}$ or address signal has been used as a trigger signal for triggering the short pulse generator shown in FIG. 2 or 5, it is possible to use other trigger signals, e.g., a chip select signal $\overline{CS}$ as well.

Further, as the short pulse generator, it is possible to use a monostable multi-vibrator or any other circuit so long as it can produce a single short pulse in response to a trigger signal.

What we claim is:
1. A semiconductor circuit comprising:
a trigger terminal;
a short pulse generation circuit having an output terminal for providing a short pulse in response to a trigger signal supplied to said trigger terminal; and
a static bootstrap circuit comprising an input terminal and an output terminal, first and second voltage source terminals, a first MOS transistor having a gate to which a predetermined voltage is applied and a current path which is connected at a first terminal to said input terminal, a MOS inverter for inverting an input signal supplied to said input terminal with a predetermined period of delay time, a second MOS transistor having the gate connected to the output terminal of said MOS inverter and the current path connected at a first terminal thereof to said second voltage source terminal, a third MOS transistor having the current path connected between said second voltage source terminal and said output terminal and the gate connected to the output terminal of said MOS inverter, a fourth MOS transistor having the gate connected to the second terminal of the current path of said first MOS transistor and the current path connected between said first voltage source terminal and said output terminal, a fifth MOS transistor having the gate connected to a second terminal of the current path of said first MOS tran- sistor and the current path connected between said first voltage source terminal and a second terminal of the current path of said second MOS transistor, capacitive means connected between the gate of said fifth MOS transistor and the connection point between said second and fifth MOS transistors, and potential setting means connected to the output terminal of said short pulse generation circuit and to the connection point between said second and fifth MOS transistors to set the potential on the connection point between said second and fifth MOS transistors to a predetermined potential level in response to a short pulse generated from said short pulse generation circuit.

2. A semiconductor circuit according to claim 1, wherein said potential setting means is a MOS transistor having the gate connected to said input terminal and the current path connected between the output terminal of said short pulse generation circuit and the connection point between said second and fifth MOS transistors.

3. A semiconductor circuit according to claim 2, wherein said MOS inverter includes input and output points, an enhancement type MOS transistor having the gate connected to said input point and the current path connected at a first terminal to said second voltage source and a depletion type MOS transistor having the gate and a first terminal of the current path commonly connected to a second terminal of the current path of said enhancement type MOS transistor and to said output point and a second terminal of the current path connected to said first voltage source terminal.

4. A semiconductor circuit according to claim 3, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

5. A semiconductor circuit according to claim 1, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

6. A semiconductor circuit according to claim 2, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

7. A semiconductor circuit according to claim 1, wherein said MOS inverter includes input and output points, an enhancement type MOS transistor having the gate connected to said input point having the gate connected to said input terminal and the current path connected at a first terminal to said second voltage source and a depletion type MOS transistor having the gate and a first terminal of the current path commonly connected to a second terminal of the current path of said enhancement type MOS transistor and to said output point and a second terminal of the current path connected to said first voltage source terminal.

8. A semiconductor circuit according to claim 1, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

9. A semiconductor circuit comprising:
   a trigger terminal;
   a short pulse generation circuit for providing a short pulse in response to a trigger signal supplied to said trigger terminal; and
   a static bootstrap circuit comprising an input terminal and an output terminal, first and second voltage source terminals, a first MOS transistor having a gate to which a predetermined voltage is applied and a current path which is connected at a first terminal to said input terminal, a MOS inverter for inverting an input signal supplied to said input terminal, a second MOS transistor having the gate connected to an output terminal of said MOS inverter and the current path connected at a first terminal thereof to said second voltage source terminal, a third MOS transistor having the current path connected between said second voltage source terminal and said output terminal and the gate connected to the output terminal of said MOS inverter, a fourth MOS transistor having the gate connected to a second terminal of said first MOS transistor and the current path connected between said first voltage source terminal and said output terminal, a fifth MOS transistor having the gate connected to a second terminal of said first MOS transistor and the current path connected between a second terminal of the current path of said second MOS transistor and the output terminal of said short pulse generation circuit, and capacitive means connected between the gate of said fifth MOS transistor and the connection point between said second and fifth MOS transistors;
   wherein the potential on the connection point between said second and fifth MOS transistors is set to a predetermined potential level through the control of the conduction state of said fifth MOS transistor in response to a short pulse generated from said short pulse generation circuit.

10. A semiconductor circuit accoding to claim 9, wherein said MOS inverter includes input and output points, an enhancement type MOS transistor having the gate connected to said input point and the current path connected at a first terminal to said second voltage source and a depletion type MOS transistor having the gate and a first terminal of the current path commonly connected to a second terminal of the current path of said enhancement type MOS transistor and to said output point and a second terminal of the current path connected to said first voltage source terminal.

11. A semiconductor circuit according to claim 10, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

12. A semiconductor circuit according to claim 9, wherein said short pulse generation circuit includes a delaying inverter for inverting the trigger signal supplied to said trigger terminal with a predetermined delay time and a NOR circuit connected to receive the trigger signal supplied to said trigger terminal and the output signal of said delaying inverter to produce a short pulse having a pulse width corresponding to the delay time of said delaying inverter.

13. A bootstrap circuit, which comprises:
   a charging circuit including a capacitor connected through a node point to a first transistor;
   means responsive to an input signal for operating said first transistor to initiate charging of said capacitor;
   means responsive to the input signal for generating a delayed pulse;
   an output circuit;
   means responsive to said delayed pulse for interrupting operation of said first transistor and charging of said capacitor and applying an output signal to said output circuit in accordance with the charge on said capacitor;
   means for generating a short pulse during application of said output signal; and
   means for applying said short pulse to said node point to reoperate said charging circuit during the duration of said short pulse whereafter said charging circuit applies an output signal to said output circuit.

14. A semiconductor circuit as defined in claim 13, wherein said short pulse applying means includes a second transistor operated by said input signal and said short pulse for applying said short pulse to said node point to charge said capacitor.

15. A semiconductor circuit as defined in claim 13, wherein said bootstrap circuit includes an output transistor rendered effective upon interruption of said charging of said capacitor for applying the output signal to said output circuit.

* * * * *